United States Patent [19]

Rzeszewski

[11] 4,360,832

[45] Nov. 23, 1982

[54] FREQUENCY SYNTHESIZER TUNING SYSTEM FOR TELEVISION RECEIVERS

[75] Inventor: Theodore S. Rzeszewski, Lombard, Ill.

[73] Assignee: Matsushita Electric Corporation, Franklin Park, Ill.

[21] Appl. No.: 23,692

[22] Filed: Mar. 26, 1979

[51] Int. Cl.³ .......................... H04B 1/32; H04N 5/44
[52] U.S. Cl. ................................ 358/191.1; 455/165; 455/183; 455/259
[58] Field of Search ............... 325/419, 420, 421, 422, 325/423, 452, 453, 457, 459, 464, 465, 468, 470; 358/191, 193, 195; 334/11, 14, 15, 16; 455/161, 165, 150, 183, 179, 180, 182, 187, 192, 196, 258, 259, 260, 261

[56] References Cited

U.S. PATENT DOCUMENTS

| | | | |
|---|---|---|---|
| 4,025,953 | 5/1977 | Sideris | 325/464 |
| 4,041,535 | 8/1977 | Rzeszewski et al. | 325/421 |
| 4,156,196 | 5/1979 | Someno et al. | 325/464 |
| 4,161,708 | 7/1979 | Friberg et al. | 325/464 |

OTHER PUBLICATIONS

A Microcomputer Controlled Frequency Synthesizer For TV, Rzeszewski, et al. IEEE Transactions On Consumer Electronics, vol. CE-24, No. 2 May 1978.
An AM-FM Digital Tuning System, by Thomas B. Mills, IEEE Transactions On Consumer Electronics, vol. CE-24, No. 4, Nov. 1978.

Primary Examiner—Tommy P. Chin
Attorney, Agent, or Firm—LaValle D. Ptak

[57] ABSTRACT

A television tuning system employs a frequency synthesizer system for establishing the tuning of the receiver. A programmable frequency divider counter is connected between the output of a reference oscillator and a phase comparator to which the output of the local oscillator in the tuner also is applied. The phase comparator output provides a tuning voltage for controlling the tuning of the local oscillator. A microprocessor is used to control the count of the programmable frequency divider and initially to set a count corresponding to the selected channel in a counter connected between the output of the local oscillator and the phase comparator. The AFT discriminator signal is used to sense the presence or absence of a properly tuned condition and to control the operation of the microprocessor for establishing the count in the programmable frequency divider counter. For a localized search, the microprocessor may drive the programmable frequency divider counter to a predetermined maximum count and then step back a fixed number of counts to a lower count and resume counting in the original direction; so that even if the AFT discriminator output is in an ambiguous condition, proper tuning can be achieved. However, if the AFT discriminator output produces the correct tuning direction information initially, the programmable frequency divider is adjusted step by step to the appropriate larger or smaller count that corresponds to correct tuning.

12 Claims, 5 Drawing Figures

FREQUENCY SYNTHESIZER TUNING SYSTEM FOR TELEVISION RECEIVERS

RELATED PATENTS

U.S. Pat. No. 4,025,953 to Sotirios Sideris and U.S. Pat. No. 4,041,535 to Rzeszewski et al, both of which are assigned to the same assignee as the present application are related to this application. The subject matter of both of these patents is incorporated into the disclosure of this application by reference.

BACKGROUND OF THE INVENTION

Both of the above mentioned patents are directed to frequency synthesizer tuning systems for use with television receivers to enable operation of the receivers with minimal viewer fine tuning adjustments. By the utilization of the frequency synthesizer tuning systems of these patents, the fine tuning adjustment which is necessary with conventional types of television receiver tuning systems has been substantially eliminated. The system employed in the '953 patent permits utilization of a frequency synthesizer tuning system which correctly tunes to a desired television station or channel even if the transmitted signals from that station are not precisely maintained at the proper frequencies. The '535 patent is directed to a signal seek tuning system adaptation of the frequency synthesizer tuning system of the '953 patent which still permits implementation of all of the desired wide-band pull in range of the frequency synthesizer system of the '935 patent.

The systems of the foregoing patents operate effectively to correct automatically for frequency offsets in a frequency synthesizer tuning system without affecting the operation of the conventional frequency synthesizer used in the system. The systems of these patents are in widespread use commercially and permit direct selection, with automatic fine tuning adjustment, of any desired VHF or UHF channel which the viewer wishes to observe. In addition, the signal seek adaptation disclosed in the '535 patent couples all of the advantages of the frequency synthesizer tuning system of the '953 patent with the desirability of providing bidirectional signal seek operation.

While the systems disclosed in the foregoing patents operate in a highly satisfactory manner to accomplish the desired results of accurate tuning without the necessity of fine tuning adjustments, the circuitry for accomplishing the desired results is somewhat complex. It is desirable to reduce the circuit complexity and the number of signal detectors for accomplishing these results without compromising the accuracy of operation of the system.

SUMMARY OF THE INVENTION

Accordingly, it is an object of this invention to provide an improved tuning system for a television receiver.

It is an additional object of this invention to provide an improved frequency synthesizer tuning system for a television receiver.

It is another object of this invention to provide an improved frequency synthesizer tuning system for a television receiver which includes a provision for adjusting the synthesizer loop for frequency offsets in the received signal with a minimum number of signal detectors.

It is still another object of this invention to tune the local RF oscillator of a television receiver to the correct frequency for a selected channel with a frequency synthesizer tuning system, and automatically to change the reference frequency of the synthesizer system, or adjust the count of a programmable divider that produces a signal that divides the frequency of the local oscillator of the tuner, if the AFT signal produced by the AFT frequency discriminator of the receiver is outside a predetermined range corresponding to correct tuning.

It is still another object of this invention to provide an improved frequency synthesizer tuning system for a television receiver which operates to adjust the synthesizer loop for frequency offsets in the received signal over a relatively wide pull in range in response to the output of the receiver frequency discriminator by changing the division ratio of a programmable frequency divider in the reference oscillator leg or local oscillator leg of the synthesizer loop from an initial nominal value to a pre-established maximum in one direction, and then resetting the division ratio to a second nominal value once the maximum is reached and continuing to incrementally change the division ratio in the same direction from the second nominal value until a properly tuned condition is indicated by the output of the receiver AFT frequency discriminator when the initial frequency mistuning causes the discriminator to give the wrong tuning direction information.

In accordance with a preferred embodiment of this invention, the frequency synthesizer tuning system for a television receiver includes a stable reference oscillator and a voltage controlled local oscillator in the tuner. A programmable frequency divider is connected between the output of the reference oscillator and one input to a phase comparator, the other input of which is supplied by the output of the local oscillator. The output of the phase comparator then comprises a control signal which is supplied to the local oscillator to control the frequency of its operation.

A counter circuit is connected to the programmable frequency divider for initially setting the divider to a predetermined division ratio upon selection of a desired channel by the viewer. The counter then operates to change the programmable fraction of the division ratio in a direction controlled by the output from the picture carrier discriminator in the absence of a second predetermined signal output derived from the receiver frequency discriminator. A control means causes the counter circuit to count in this direction until it is determined that a station is tuned or a predetermined maximum count is attained if no station is correctly tuned, thereupon resetting the counter circuit to a count which is a predetermined amount less than the maximum predetermined count. Counting is continued in the same predetermined direction from the new lesser count to continuously change the programmable fraction of the frequency divider in accordance with the state of operation of the counter. Operation of the counter is terminated by the control means in response to a predetermined signal from the output of the AFT frequency discriminator indicating that a station is correctly tuned; so that the system automatically adjusts for frequency offsets of the received signal which otherwise would cause the station to be mistuned if a conventional frequency synthesizer tuning system were used.

DETAILED DESCRIPTION

Referring now to the drawings, the same reference numbers are used throughout the several figures to designate the same or similar components.

Figure 1:
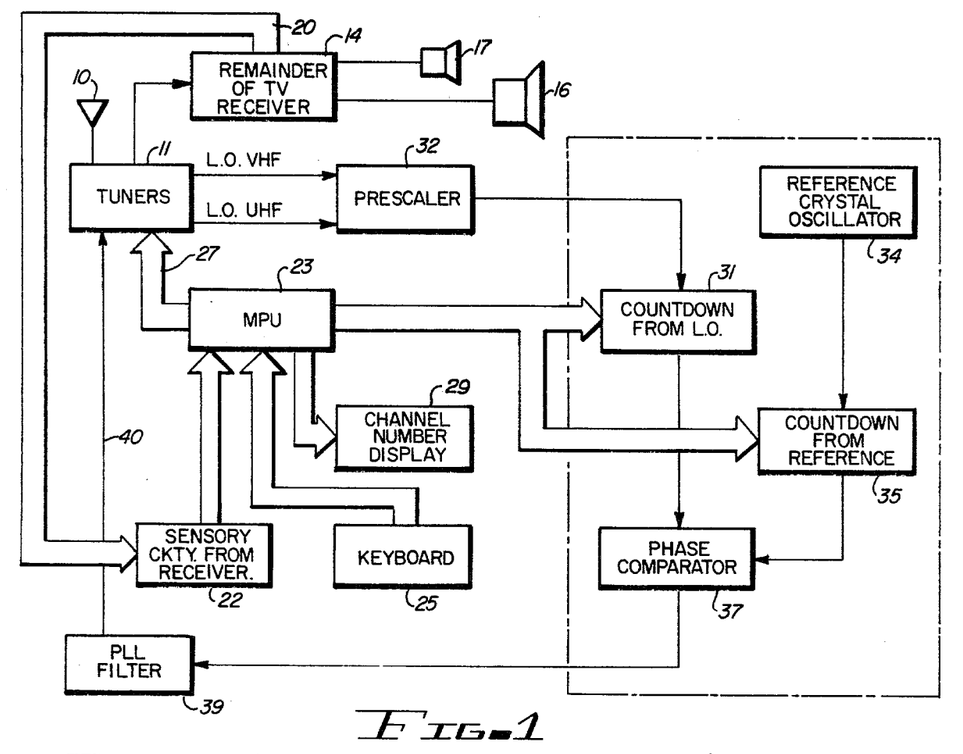
FIG. 1 is a block diagram of a television receiver employing a preferred embodiment of the invention.

FIG. 1 is a block diagram of a television receiver, which may be a black and white or color television receiver. Most of the circuitry of this receiver is conventional, and for that reason has not been shown in FIG. 1. Added to the conventional television receiver circuitry of FIG. 1, however, is a frequency synthesizer tuning system, in accordance with a preferred embodiment of the invention, which is capable of automatically changing the reference when a frequency offset exists in the received signal for a particular channel.

Transmitted composite television signals, either received over the air or distributed by means of a master antenna TV distribution system, are received by an antenna 10 or on antenna input terminals to the receiver. As is well known, these composite signals include picture and sound carrier components and synchronizing signal components, with the composite signal applied to an RF and tuner stage 11 of the receiver. The stage 11 includes the conventional RF amplifiers and tuner sections of the receiver, including a VHF oscillator section and a UHF oscillator section. Preferably, the UHF and VHF oscillators are voltage controlled oscillators, the frequency of which is varied in response to a tuning voltage applied to them to effect the desired tuning of the receiver.

The output of the RF and tuner stages 11 is applied to the remainder of the television receiver 14, which includes the IF amplifier stages for supplying conventional picture (video) and sound IF signals to the video and sound processing stages of the receiver 14. The circuitry of the receiver 14 may be of any conventional type used to separate, amplify and otherwise process the signals for application to a cathode ray tube 16 and to a loudspeaker 17 which reproduce the picture and sound components, respectively, of the received signal.

The receiver 14 also includes a conventional AFT or automatic fine tuning discriminator circuit and additionally may include a synch separator circuit for producing an output in response to the presence of vertical synchronization pulses, a picture carrier detection circuit, and an automatic gain control (AGC) amplifier. Outputs representative of these sensor components are shown as being coupled over a group of leads 20 to sensory circuitry 22, which in turn couples outputs representative of the operation of these various sensor circuits to a microprocessor unit 23 for controlling the operation of the microprocessor unit.

The microprocessor unit 23 is utilized in the system of FIG. 1 for controlling the operation of a frequency synthesizer tuning system capable of automatic offset correction. When the viewer desires to select a new channel, he enters the desired channel number into a channel selection keyboard 25. There are a number of different keyboards which may be employed to accomplish this function, and the particular design is not important to this invention. The channel selector keyboard 25 also may include switches or keys for initiating a signal seek function in either the "up" or "down" direction.

Information represented by the selection of channel numbers on the keyboard 25 is supplied to the microprocessor unit 23 which provides output signals over a corresponding set of leads 27 to the tuners 11 to effect the appropriate band switching control for the tuners 11 in accordance with the particular channel which has been selected. In addition, the keyboard 25, operating through the microprocessor unit 23, provides output signals which operate a channel number display 29 to provide an appropriate display of the selected channel number to the viewer.

The microprocessor unit 23 also processes the signals which are used to operate the channel number display 29 through a multiplexing circuit operation to decode the selected channel number into a parallel encoded signal. This signal is applied to corresponding inputs of a count-down counter or programmable frequency divider 31 to cause the division number of the divider 31 to relate to the divided down frequency of the tuner local oscillators connected to the input of the divider 31 through a prescaler divider circuit 32 to the frequency of a reference oscillator 34. Thus, the division number or division ratio of the local oscillator frequency obtained from the output of the programmable divider 31 is appropriately related to the frequency of the reference crystal oscillator 34.

The output of the oscillator 34 also is applied through a countdown circuit or programmable frequency divider 35. Conventional frequency synthesizer techniques are employed; and the microprocessor unit 23 automatically compensates, through appropriate code converter circuitry, for the non-uniform channel spacing of the television signals. It has been found most convenient to cause the programmable frequency divider 31 to divide by numbers corresponding directly to the oscillator frequency of the selected channel, for example, 101, 107, 113 . . . up to 931.

In accordance with the time division multiplex operation of the microprocessor 23, the count of the programmable frequency divider 35 initially is adjusted to a fixed count by the application of appropriate output signals from the microprocessor unit 23 to a point selected to be at or near the mid-point of the operating range of the programmable frequency divider 35. Thus, the output of the divider 35 is a stable reference frequency (because the input is from the reference crystal oscillator 34) which is used to establish initially and to maintain tuning of the receiver to the selected channel.

The output of the programmable divider 35 is applied to one of two inputs of a phase comparator circuit 37. The other input to the phase comparator circuit 37 is supplied from the selected one of the VHF or UHF oscillators in the inner stages 11 through the programmable frequency divider 31. The phase comparator circuit 37 operates in a conventional manner to supply a DC tuning control signal through a phase locked loop filter circuit 39 and over a lead 40 to the oscillators in the tuner system 11 to change and maintain their operating frequency.

With the exception of the use of the microprocessor unit 23, the operation of the system which has been described thus far is that of a relatively conventional frequency synthesizer system incorporated into a television receiver. This system is similar to the system of the '953 patent. As in the system of that patent, the system shown in FIG. 1, when the transmitted station or station received on a master antenna distribution system provides the station or channel signals at the proper frequency, operates as a relatively conventional frequency synthesizer system. If, however, there is a frequency offset in the received signal to cause the carrier of the received signal to be displaced from the frequency which it should have to some other frequency, it is possible that the system would give the appearance of mistuning to the received station. The microprocessor 23, operating in conjunction with the sensory circuitry 22, is employed in conjunction with the countdown or programmable frequency divider circuit 35 to eliminate this disadvantage and still retain the advantages of frequency synthesizer tuning.

Figure 2:
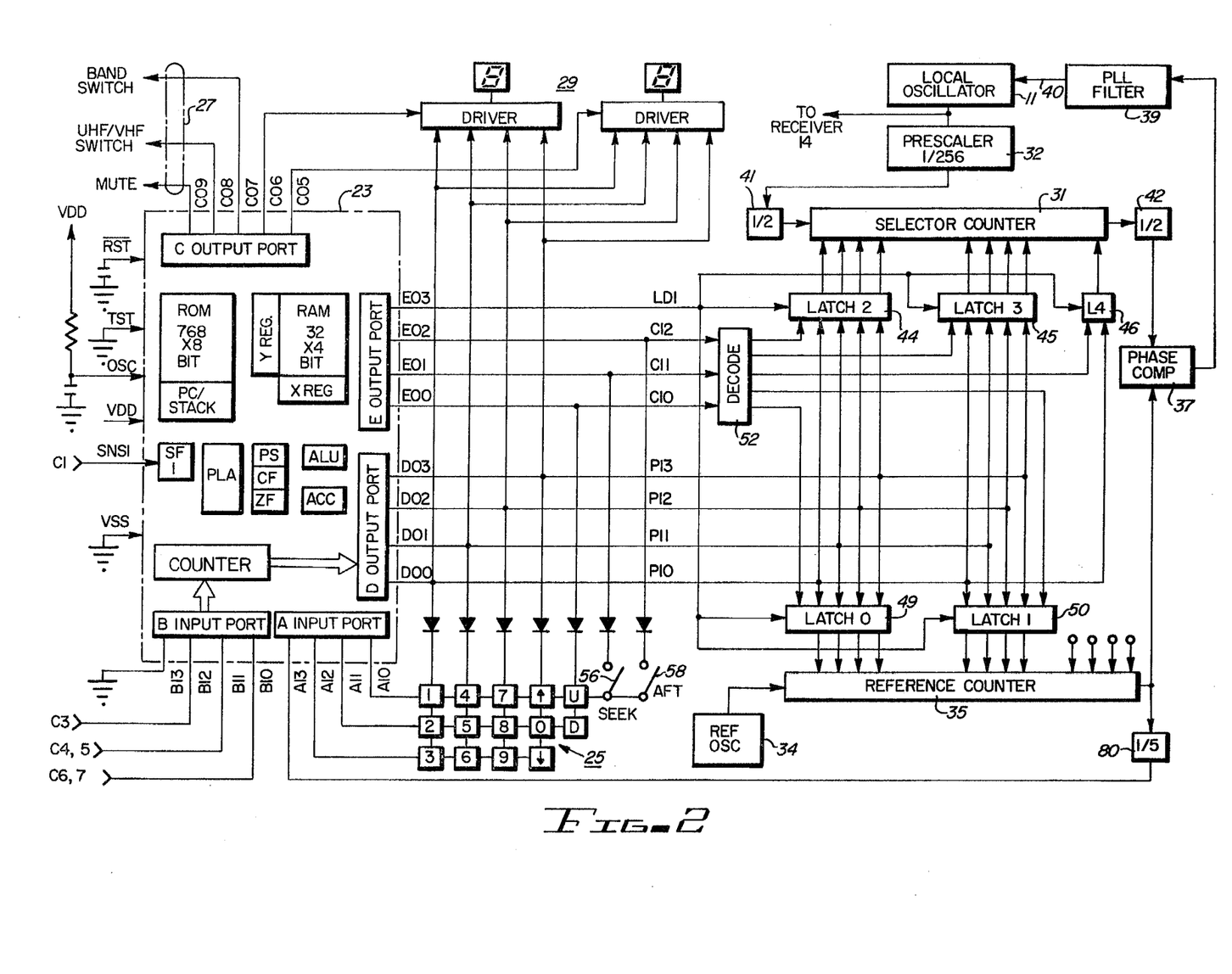
FIG. 2 is a detailed block diagram of a portion of the circuit of the preferred embodiment shown in FIG. 1.

Reference now should be made to FIG. 2 which shows details of the interface between the keyboard 25, the microprocessor unit 23, and the circuitry used in the frequency synthesizer portions of the system. A commercially available microprocessor which has been used for the microprocessor 23, and which forms the basis for the diagramatic representation of the microprocessor in FIG. 2, is the Matsushita Electronics Corporation MN1402 four-bit single-chip microcomputer. This microcomputer has two, four-bit parallel input ports labeled "A" and "B". In addition, three output ports, a five-bit output port "C" and two four-bit output ports "D" and "E" are provided. The internal configuration of the microcomputer 23 includes an arithmetic logic unit (ALU), a read only memory (ROM) for storing instructions and constants, and a random access memory (RAM) used for data memory, arranged into four files, each file containing 16 four-bit words. These words are selected by X and Y registers and this memory is used, for example, for timers, counters, etc. and also is used to hold intermediate results. The microcomputer 23 is programmed to permit it to operate in conjunction with the remainder of the circuits shown in FIG. 2. The programming techniques are standard, and the microcomputer itself is a standard commercially available circuit component.

There are several system parameters that must be selected in the operation of the system shown in FIG. 2. The selection of the nominal frequency of the two signals that feed the phase comparator circuit 37 is an example. Channel selection is provided by changing the frequency division ratio of the selector counter 31 which divides the local oscillator signal after this signal is passed through a prescaler circuit 32 and a divide-by-two divider circuit 41. The nominal frequency from the programmable frequency divider 31 (selector counter) is selected so that the local oscillator 11 can be set exactly on frequency for all channels.

Since the frequency divider 31 is able to divide only by integer numbers, one distinct frequency possibility in the range of one KHz is obtained, another in the range of two KHz, etc. A choice must be made as to which of these values is optimum. Each value yields the nominal frequency for all of the 82 channels by simply multiplying by an appropriate integer for each channel. To simplify the phase locked loop filtering problem by the filter 39, it is desirable that the frequencies of the signals supplied to the phase comparator 37 are as high as possible. This permits rapid acquisition of a new channel along with a very clean DC control signal to adjust the local oscillator. A trade-off for this, however, must be made to permit fine tuning adjustment of the local oscillator automatically to correctly tune in stations which are off their assigned frequency, or to manually provide this feature, if desired. For this situation, it is desirable to have the frequencies of the signals supplied to the phase comparator 37 to be as low as possible. This permits finer incremental frequency changes resulting in more precise tuning to the station which is off frequency.

A compromise solution which is utilized in the circuit of FIG. 2 is to cause a frequency division chain from the local oscillator 11 in the tuner to the phase comparator 37 to be composed of the fixed divide-by-256 prescaler 32, and a fixed divide-by-4 division, which is accomplished by the divider 41 at the input of the counter 31 and a second divider 42 at the output of the counter 31. The variable frequency divider counter 31 then is loaded by means of three latch circuits 44, 45 and 46 at an appropriate time by the time division multiplex operation of the microcomputer 23 with a number that programs the programmable frequency divider counter 31 to divide by the numerical value of the frequency of the local oscillator in MHz for the channel selected. For example if the receiver is to be tuned to channel 2, which has a nominal local oscillator frequency of 101 MHz, the programmable frequency divider 31 is set to divide by 101. If the receiver is to be tuned to channel 83, which has a nominal local oscillator frequency of 931 MHz, the programmable frequency divider 31 is set to divide by 931. In both cases, the variable divider 31 produces a 1 MHz signal. However, because of the fixed divide-by-256 and the two fixed divide-by-two dividers in series with the programmable divider 31, an output frequency of 976.5625 Hz is supplied from the output of the divider 42 to the upper input of the phase comparator 37.

The division ratio of the selector counter 31 is established by appropriate output signals from the latch circuits 44, 45 and 46, as mentioned above. The initial operation for changing, or maintaining, the division ratio of the divider 31 is established by an entry of the two digits of the selected channel number in the keyboard 25. The microcomputer 23 operates as a time division multiplex system for continuously monitoring the input ports and the output ports to control the operation of the remainder of the system. The selection of the two digits of the desired channel number is effected by a time division multiplex scanning of the outputs of the D output port of the microcomputer 23 and providing that information at the A input port. From here the information is translated again to the D output ports to the appropriate drivers of the channel number display circuit 29 and to the latches 44, 45 and 46, and to a pair of similar four bit latches 49 and 50 which control the divider ratio of the counter 35.

Although the D output ports of the microcomputer 23 are connected in common to all of these various portions of the circuit, the selection of which of the latches are enabled to respond to the particular output signals appearing on the D output ports at any given time is effected through the C and E output ports of the microcomputer 23 in a time division multiplex fashion. A decoder circuit 52, connected to the lowermost three outputs of the E output port of the microcomputer 23, is used to apply unique decoding signals at different times in the time division multiplex sequence of operation of the microcomputer 23 to the five latch circuits 44, 45, 46, 49 and 50, respectively. At any given time in the sequence, only one of these latch circuits is enabled for operation. A latch load signal is applied from the upper output (EO3) at each cycle of operation of the signals appearing on the E output port to set the latch circuit which is enabled by the output of the decoding circuit 52 with the data appearing on the other inputs to the latch circuit. This data simultaneously appears on the four outputs of the D output port of the microcomputer 23.

Thus, in rapid sequence, the latch circuits 44, 45 and 46 are set to store the division number corresponding to the selected channel entered onto the keyboard 25, and the latch circuits 49 and 50 are each operated to set the programmable divider reference counter 35 to a center or nominal count, which is always the same upon the selection of a new channel on the keyboard 25. Similarly the two right hand outputs of the C output port (CO6 and CO5) enter the two digits of the selected channel number in the drivers of the display circuit 29 at the proper time in the binary encoded sequence when these digits appear on the four-bit binary encoded representation of the D output port. This results in a visual display of the channel number selected.

In addition to the selection of a channel number directly by the keyboard 25, the keyboard also may include an additional switch 56, which is scanned in the time division multiplex sequence to determine if the receiver is placed in a "seek" mode of operation (when the signal seek capability is incorporated into such a receiver). Operating in conjunction with the signal seek switch 56 are a pair of "up" and "down" seek direction input switches down with a graphic representation of the seek directions on the keyboard 25. A further provision is provided by two keys labeled "U" and "D", which are used for "manual" fine tuning of the receiver in the "up" or "down" directions depending upon which of the two keys U or D has been operated. The keyboard 25 includes one additional switch 58 which may be used to disable the automatic fine tuning (AFT) portion of the circuit by rendering the microcomputer insensitive to the signal output from the AFT circuit, in a manner described more fully subsequently.

As is apprent from the foregoing, the microcomputer 23 provides the intelligence, decision making, and control for the system operation. It is a complete self contained computer. The decisions or signal inputs upon which the microcomputer 23 bases its operation include, in addition to the inputs from the keyboard 25, inputs on sensory inputs into the B input port and into the S1 input as shown in FIG. 2. These input signals are used to provide an indication to the microcomputer 23 of the presence or absence of a received signal; and if the presence of such a signal is indicated, the inputs provide a further indication of the accuracy of the tuning of the receiver to that signal. If the system is being operated solely in a manual mode of operation (AFT switch 58 open), the microcomputer 23 disregards all of this sensory information and tunes to the frequency allocation of the channel selected in the manner described above. The system will stay tuned to this condition, operating as a conventional frequency synthesizer, whether or not a station is present in the received signal.

When the system is placed in its automatic mode of operation (similar to the mode of operation of the above mentioned '953 patent), a bidirectional counter, integrally formed as part of the microcomputer 23, continuously adds or subtracts one number at a time from the nominal value or programmable division fraction entered into the programmable frequency divider 35 at the outset of each new channel number selection when frequency offset (mistuning) is present. Thus, automatic offset correction is provided for any channel which is off its assigned frequency. The offset correction automatically adjusts the frequency of the local oscillator by changing the division ratio of the signal from the reference oscillator 35 applied to the lower input of the phase comparator 37. By doing this, the output of the phase comparator 37 applied to the local oscillator 11 varies to cause the oscillator to be tuned in the proper direction to compensate for the transmitting station mistuning.

Figure 3:
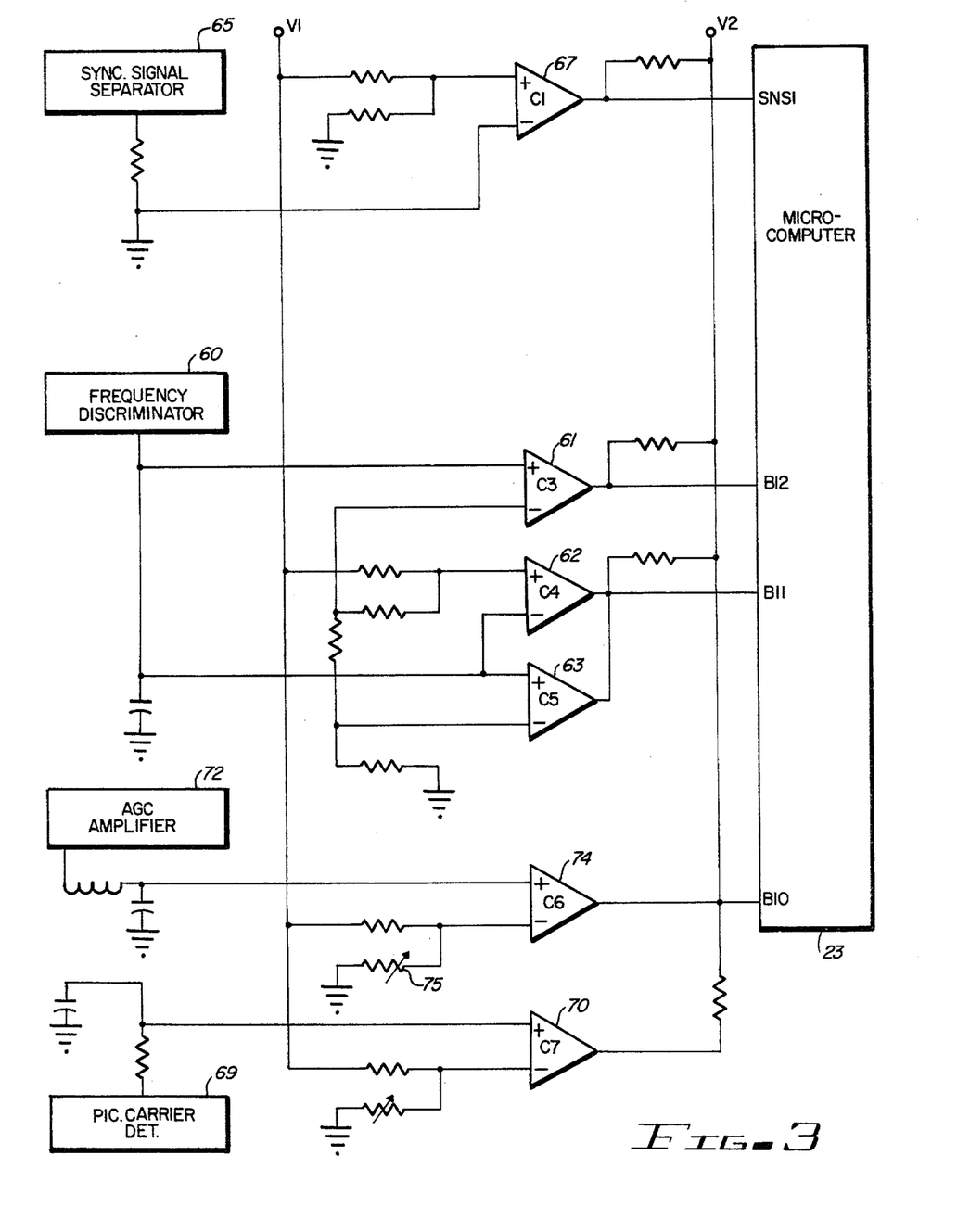
FIG. 3 is a detailed circuit diagram of a portion of a circuit shown in FIG. 1.

When the system is operating in its automatic mode of operation, the microcomputer 23 responds to the sensory information applied to it on its B input ports and on the S1 input port shown in FIG. 2. These inputs are obtained from the various outputs of the operational amplifiers shown connected to the corresponding input ports in the detailed circuit of FIG. 3. Depending upon whether the receiver is provided with a signal seek feature or not, one or more of the sensory inputs of the circuit of FIG. 3 are used. The system shown in the drawings has a capability of correcting for frequency offsets larger than ±1.5 MHz on channels 2 and 7 and approximately 2 MHz on channels 6 and 13. The remainder of the channels have a range between these two values.

If the receiver is not tuned properly, the microcomputer 23 executes a localized search of the tuning range mentioned above. Since there is a necessary settling down time for the tuning of a television receiver immediately following selection of a new channel, a time interval of 250 milliseconds has been selected to prevent any localized search or offset frequency correction until the expiration of this "settling down" time period. If, at the end of this 250 millisecond time interval, a properly tuned station is present, this is indicated by the sensory outputs from the television receiver and no localized search is effected to change the division ratio or programmable divider count in the reference counter 35 for a system that also has signal seek.

A system with no signal seek capability is described later that requires less sensory input but which uses a time period where a forced search is required directly after the settling time interval.

Upon termination of the 250 millisecond settling down period, the microcomputer 23 is rendered responsive to the sensory input signals on its sensory input signal ports. In the simplest form, only the output of the frequency discriminator 60 (FIG. 3) applied to three comparators 61, 62 and 63 is used to provide the necessary tuning information to the microcomputer 23. The outputs of these comparators are applied to the B12 and B11-inputs of the micrcomputer. The comparator 61 simply is a conventional comparator for determining whether or not the output of the frequency discriminator is positive or negative, as indicated in the upper waveform of FIG. 5. The comparators 62 and 63 are each adjusted with appropriate reference input levels to provide a narrow window centered about the center tuning frequency (fc) of the receiver. If the tuning of the receiver, as indicated by the output of the frequency discriminator 60, is outside this window on either side of the central axis shown in FIG. 5, one output condition is indicated on the input terminal B11 of the microcomputer. Only when the tuning frequency is within the tuning window, indicative of a properly tuned receiver, is the appropriate input applied to the microcomputer input terminal B11. This input overrides any other input that may be present on the input terminal B12 and is indicative of a properly tuned receiver. The input from the frequency discriminator 60, as applied to the microcomputer on its input port B12, is used to determine the direction of operation of the counter of the microcomputer for the localized search count signals applied to the latch circuits 49 and 50 to change the count of the reference programmable divider counter 35 on a step-by-step basis.

Figure 5:
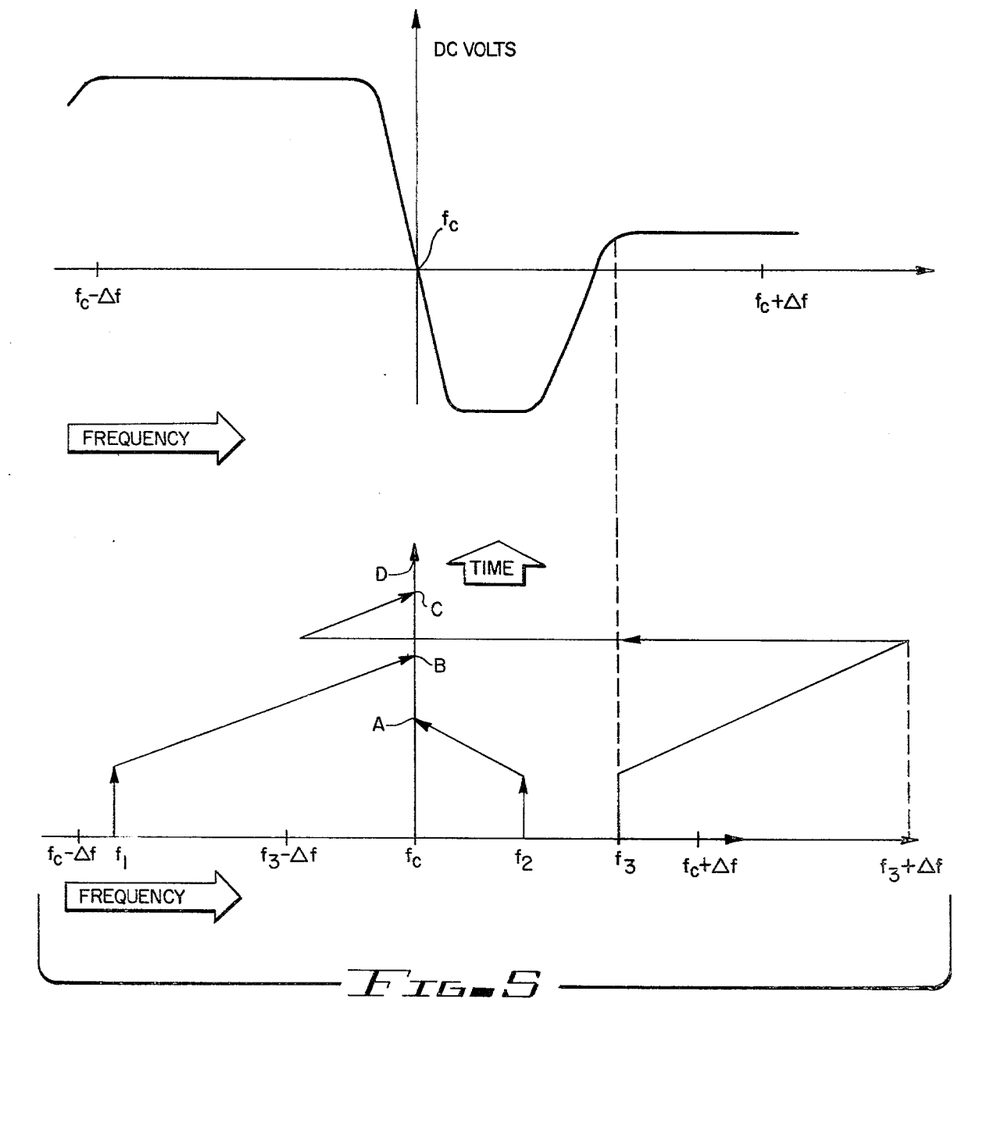
FIG. 5 shows a waveform and time/frequency chart, respectively, useful in explaining the operation of the circuit shown in FIGS. 1, 2 and 3.

The lower graph of FIG. 5 plots the relative frequency of the local oscillator 11 to the received signal frequency with respect to time. The various arrows are used to indicate the manner of operation of the counter in the microcomputer 23 in conjunction with the reference counter 35 for adjusting for any mistuning conditions which may exist after the initial station selection has been effected in the manner described above.

If the receiver is properly tuned, the outputs from the comparators 62 and 63 of FIG. 3 which are combined together and applied to the input port B11 of the microcomputer 23, provide an indication that the tuning is within the properly tuned center frequency window. As a consequence no further operation of the microcomputer to change any of the outputs applied to the latch circuits 49 and 50 for the duration of this condition is effected. On the other hand, if the receiver is mistuned on either side of the proper tuning frequency, the various operating characteristics shown in FIG. 5 are effected.

Assume initially that the receiver is capable of making tuning adjustments over a range of fc plus $\Delta f$ to fc minus $\Delta f$, as indicated in the top waveform of FIG. 5. Three specific examples of mistuning will then be considered. Initially, assume that the local oscillator is mistuned relative to the received signal to a frequency f1 as shown in the lower graph of FIG. 5. In this condition, the output of the frequency discriminator 60 is positive since this signal frequency lies to the lefthand side of the center or properly tuned region of operation of the discriminator. Under this condition of operation the input signal applied to the sensor port B12 of the microcomputer 23 is such that the microcomputer counter is caused to advance in a positive direction to change the programmable division ratio or count of the reference counter 35 in a manner to force the output of the phase comparator 37 to adjust the frequency of the local oscillator until the proper tuning indicated at point B in the lower graph of FIG. 5 is reached. The time interval for accomplishing this result is measured from the upper end of the arrow representative of the frequency f1 to the point B.

Now assume that the receiver mistuning is to a frequency f2 which as shown in FIG. 5 as located on the right hand side of the center axis fc. In this condition, the discriminator output is negative. This is reflected in the output of the comparator 61 applied to the input port B12 of the microcomputer 23. The polarity of this signal is identified by the microcomputer 23 to cause the counter in it to operate in the reverse direction. As this count is applied on a step-by-step basis through the latch circuits 49 and 50 to the reference counter 35, the division ratio or count of the programmable frequency divider 35 is changed. As a result, the reference oscillator signal applied to the phase comparator 37 causes the phase comparator 37 output to drive the local oscillator frequency in a direction opposite to that considered in the first example. This is shown by the vector interconnecting the top of the arrow representative of f2 to point A on the time/frequency graph of FIG. 5.

As discussed in the general discussion above, whenever the tuning frequency reaches the narrow window on either side of fc, the outputs of the comparators 62 and 63 provide the necessary indication on the sensory input port terminal B11 to cause termination of the operation of the counter in the microcomputer 23. Then the reference counter 35 remains set to the count attained just prior to the appearance of this input signal on the input port B11 of the microcomputer 23.

A third mistuning condition can exist, and ordinarily this condition results in an ambiguity which cannot be corrected simply by responding to the signal polarity at the output of the frequency discriminator. This is indicated by a mistuned condition where the difference between the local oscillator frequency f3 and the transmitter frequency is such that the signal f3 lies in the range to the right of the negative portion of the discriminator output shown in the upper waveform of FIG. 5. In this condition, the associated sound causes the discriminator output to be positive; so that the television receiver normally would attempt to tune toward the next adjacent channel and away from the properly tuned center frequency of the channel which is desired. The output of the discriminator 60 in this situation is the same as it was in the first example considered for frequency f1; so that the counter of the microprocessor 23 operates to change the count in the reference counter 35 in a manner to cause the local oscillator frequency to go higher toward a frequency $f3 + \Delta f$, as shown in FIG. 5.

A predetermined number of counts of the counter in the microcomputer 23 are necessary for the microcomputer to count through the frequency range $\Delta f$, and this range is selected to be within the pull in or operating range of the system. Once this count has been attained, the microcomputer counter immediately is reset back to a count which corresponds to a frequency 2 $\Delta f$ lower than the frequency attained by the maximum count. This is indicated in FIG. 5 by the frequency $f3 - \Delta f$. Because the microcomputer counter is limited to counting a number of counts equal to $\Delta f$, this new frequency now is on the lefthand side of the center line fc, shown in both waveforms of FIG. 5. This places the local oscillator frequency at a point such that the frequency discriminator output is the positive output shown on the lefthand side of the upper waveform of FIG. 5. Counting continues in the same direction as previously. This time, however, it is in a proper direction to bring about correct tuning; and when the center frequency is reached, the outputs of the comparators 62 and 63 cause the microcomputer 23 to stop its count. The proper tuning point attached is indicated at point C on the graph of the lower part of FIG. 5.

Because the counter of the microcomputer is limited to a maximum count equivalent to $\Delta f$ above its initial count and thereupon is reset to a new count equivalent to 2 $\Delta f$ lower than the maximum count, it is not necessary to utilize any other sensory inputs in order to properly tune the receiver over a wide pull in range (as much as plus or minus 2 MHz). Only the output of the frequency discriminator 60 conventionally used in television receivers is necessary to provide the necessary sensory inputs.

Although applicant has found that it is preferable to correct for mistuning or frequency offsets by adjusting the count or division ratio of the counter 35, such offset adjustments also could be effected by adjusting the count in the counter 31 in the local oscillator signal line. The operation in such a case is the same as described above for adjusting the count in the counter 35.

If the receiver is to be used with an automatic signal seek mode of operation, however, additional sensory inputs are necessary. These inputs operate in conjunction with the output of the frequency discriminator 60. The operation of the microcomputer 23 in controlling the count of the reference programmable frequency counter divider 35 is the same as described above. The additional sensory inputs simply are used in conjunction with the outputs of the comparators 62 and 63 to signal the microcomputer 23 to assure that tuning is to a picture channel rather than an adjacent sound channel. This is accomplished by utilizing the output of the synchronizing signal separator 65 which is applied to a comparator 67 to produce an output signal to the SNS1 sensory input of the microcomputer 23 only when vertical synchronizing signal components are present.

In addition, the output of a picture carrier detector 69 is applied to the input of a comparator 70 to produce an output to the B10 sensory input of the microcomputer 23. If the picture carrier detector 69 is producing an output indicative of the presence of a carrier, but no output is being obtained from the vertical synch separator 65 at the same time, the system is mistuned to a sound carrier and the microcomputer 23 is permitted to continue its localized search until a properly tuned station is found. Only when there is coincidence of signals from the picture carrier detector 69, the synch signal separator 65, and the automatic frequency discriminator window as determined by the comparators 62 and 63, is the microcomputer operation terminated to indicate that a properly tuned channel is present.

Further insurance of tuning the receiver only to a strong signal also can be provided by the addition of an AGC amplifier 72. This is connected to a comparator 74 coupled to the B10 input port along with the output of the picture carrier detector comparator 70. When the AGC amplifier 72 is used as a sensory input, the microcomputer operation, when the system is used in a signal seek mode, is only terminated to indicate reception of a valid signal when that signal is strong enough to produce the desired output from the comparator 74. The signal level which is acceptable is set by a potentiometer 75.

It should be noted that when the system is operated in a signal seek mode, the sensory inputs must indicate the reception of a properly tuned signal within a pre-established time period. If no signal is sensed by the various sensory input circuits operating in conjunction with one another as described above, the microcomputer 23 automatically steps to the next channel number and repeats the sequence of operation described above. This is when it is placed in its signal seek mode of operation. If signal seek is not employed, the additional sensory circuits 65, 69 and 72 are not necessary, and the inputs to the microcomputer which are provided from these sensory circuits are not utilized. The sensory signal input which is used both for a receiver without a signal seek capability of operation and for a receiver which has a signal seek mode of operation in it, is the output of the frequency discriminator 60 operating in conjunction with the comparators 61, 62 and 63 as described above.

As indicated above, the wideband method of tuning precisely to an incoming signal that is at the wrong frequency described here only needs the frequency discriminator sensory information. The method that uses the additional sensors described above is needed to make this system operate compatibly with signal seek but it is not restricted to seek operation.

For a system that does not use signal seek operation, only the frequency discriminator sensory input is required for proper operation. The discriminator 60 is used for both fine tuning direction information and to produce a frequency window to indicate the presence of a correctly tuned station (channel verification). Initially, after a channel change, there is a 250 msec settling time, the same as the operation described above with compatible seek. However, after that comes a period of time where a forced localized search is produced by the microcomputer 23. The forced search is needed to insure that the system will correctly tune to stations that initially may be tuned to the undesired zero voltage crossover in the right half of the upper curve of FIG. 5. Such signals may be within the frequency window of the discriminator 60; and if a search is not forced, this system will not correctly tune. The compatible seek system described previously correctly tunes the local oscillator without a forced search, because the picture carrier detector and vertical detector do not give an output for this situation and the system automatically goes into its search mode of operation. However, the non-seek system does not have a picture carrier sensor input and must be forced to search for an initial period of time sufficient to allow the system to tune up to its maximum frequency and then reset (loop) back to a frequency 2Δ f lower. Then it is tuned to the positive left half portion of the discriminator curve (FIG. 5) and the frequency window created by the discriminator 60 is sufficient to insure proper tuning. If the discriminator output produced by the desired incoming signal created an initial situation that produces the correct tuning direction information, i.e. in the left half of the curve of FIG. 5, or in the right half portion that gives the correct direction and frequency window information, the forced search would not be needed. However, the forced search will produce a correct tuning situation anyway. In these cases, the tuning either is correct to begin with or correct tuning is reached quickly. Then, even though the forced search is active, it simply alternates up and down through the correct tuning point because each time the receiver is tuned a little high in frequency, it produces a negative output from the discriminator 60; and the tuning direction signal causes the system to tune down in frequency. Then, a positive discriminator output is produced, and the system tunes up in frequency. This continues until the forced search is removed by time-out of the microcomputer 23 (a fraction of a second). At such time, the receiver is correctly tuned by the frequency window of the discriminator to be very near fc. The system cannot tune to the undesired discriminator crossover shown in the right half portion of FIG. 5 because the polarity of the tuning direction signal always causes it to tune away from that point.

Figure 4:
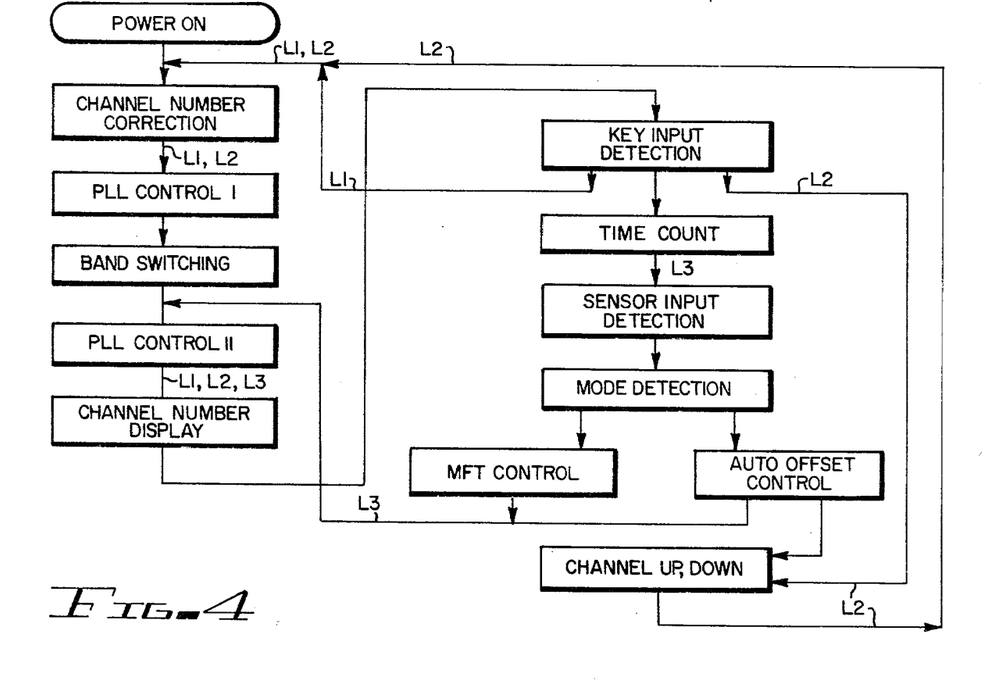
FIG. 4 is a flow chart of the control sequence of operation of the circuit shown in FIGS. 1 and 2.

FIG. 4 shows the control sequence of the system which is stored in the ROM (Read Only Memory) of the microcomputer 23. The microcomputer 23 operates by always running through the flow sequence, via loops L1, L2 and L3. Loop L1 corresponds to a new channel selection by two digit number entry. Loop L2 corresponds to channel number increment or decrement by an up or down key operation, respectively, or by seek operation. Loop L3 corresponds to fine tuning, either manual or automatic. To obtain exact timing for system control, the microcomputer 23 receives a standard timing pulse from the output of the reference counter 35 divided in a divide-by-5 counter 80 and applied to the A13 input port of the microcomputer 23. The control functions which are programmed into the microcomputer 23, as indicated in the flow chart of FIG. 4, are outlined in the following paragraphs.

Channel Number Correction:

Any invalid two digit channel number entry (0, 1, 84, 99) is corrected. When the operation of the receiver is in the signal seek mode, the next channel up from 83 is channel 2, and the next lower channel from channel 2 is 83.

PLL Control I:

For a given channel number, a corresponding binary code for the PLL selector counter 31 is derived as described previously. For UHF channels, the local oscillator frequency separation between two adjacent channels is 6 MHz and the code for PLL is generated by the microcomputer 23 through means of a simple calculation. This code then is transferred from the microcomputer 23 to the latches 44, 45 and 46 as described previously.

PLL Control II:

This routine of the microcomputer 23 is used to transfer the fine tuning data to the latches 49 and 50 which control the count of the reference counter 35 in the PLL circuit.

Channel Number Display:

The channel number is transferred from the microcomputer 23 to the driver latches of the display driver circuit 29.

Key Input Detection:

The keyboard is arranged as the matrix circuit shown in FIG. 2. ROM programming for scanning and acknowledging a keyboard entry only after successive indications provides protection against false entry due to contact bounce. The four data output lines of the D output port of the microcomputer 23 are used to transfer data to the phase lock loop section of the circuit and to the display circuit 29, as well as for scanning the keyboard matrix circuit.

Time Count:

The microcomputer 23 receives a basic timing pulse of approximately 200 Hz from the output of the divider 80 and performs various controls for each timing pulse. By way of example, sensing for the vertical synch pulse input (when the system is used with a signal seek capability) on the input port SNS1 takes place every 2.5 milliseconds. Automatic seek timing is selected to be 133 milliseconds for UHF channels. All of these timing pulses are derived from the basic synchronization timing pulse applied to the microcomputer on the A13 input port from the output of the divider 80. Various other timing values used in the microcomputer to properly time multiplex sequence the operation are derived from this basic timing pulse.

Sensor Input Detection:

As described previously, the output of the comparators shown in FIG. 3 reflect the status of the tuning of the television receiver. If no signal seek mode of operation is used, only the frequency discriminator or AFT discriminator 60 is necessary. When a system is being used in a signal seek mode, a proper television signal receipt is indicated by the presence of a vertical synch signal at the output of the synch signal separator 65 and corresponding outputs are applied to the input leads B10 and B11 (high level input signals) indicative of tuning to the "correct tuned" frequency discriminator window and reception of a picture carrier. As stated previously, the signal present on the B12 input lead is used to determine the direction of tuning when the receiver is operated in its automatic mode.

Mode Detection:

The status of the seek and automatic/manual (A/M) switches are detected. If the A/M switch (not shown) is in its automatic position, automatic seek and offset correction are active. If only the seek switch is on, only seek is performed. If the A/M switch is in manual, manual fine tuning (MFT) is active.

Automatic Mode:

If the TV receiver is not properly tuned for VHF channels in automatic, the local oscillator frequency is shifted automatically toward proper tuning. The fine tuning data is generated in the microcomputer 23 and is transferred to the latches 49 and 50 for the reference counter 35 in the PLL circuit.

Manual Fine Tuning (MFT) Control:

The local oscillator frequency is shifted by pushing the fine tuning up (U) or down (D) push bottom or switch. This MFT control can be applied to VHF channels as well as to UHF channels.

Channel Up/Down:

When a channel up (upward pointing arrow) or down (downward pointing arrow) key closure in the keyboard 25 is detected, or upon a direct access to an unused channel, this routine is activated and the system will advance to the next channel in the selected direction.

The foregoing embodiment of the invention which has been described above and which is illustrated in the drawings is to be considered illustrative of the invention, which is not limited to the specific embodiment selected for this purpose. For example, hard-wired logic could be used to achieve the various circuit operations which are accomplished by the microcomputer 23 in conjunction with the other portions of the system. The relative ease of programming and debugging the microcomputer 23, however, make it much simpler to implement the system operation with the microcomputer than with hard-wired logic. With respect to the sensor circuit inputs to the system, an added degree of operating assurance can be provided by the addition of a sound carrier sensor in addition to the picture carrier sensor shown in FIG. 3. If this feature is desired, the output of the comparator for the sound carrier is combined with the outputs of the comparators 70 and 74 at the input terminal B10 of the B input port of the microcomputer 23. Because of the manner of the circuit operation which has been described previously, however, the addition of a sound carrier detector to the system is not considered necessary, even for a system operating in the signal seek mode of operation. This is in contrast to conventional television receivers having a signal seek operation, in which detection of the sound carrier generally is a necessity to insure that mistuning of the receiver to an adjacent sound carrier does not take place.

I claim:

1. A tuning system for the tuner of a television receiver capable of receiving a composite television signal and including frequency discriminator (AFT) circuit means, said system including in combination:
   a reference oscillator providing a reference signal at a predetermined frequency;
   a local oscillator in the tuner providing a variable output frequency in response to the application of a control signal thereto;
   a programmable frequency divider means having first and second inputs coupled respectively to the output of said reference oscillator and said local oscillator for producing an signals on said first and second outputs having a frequencies which are a programmable fraction of the frequency of the signals applied to the inputs thereto;
   phase comparator means having one input coupled with the first output of said programmable frequency divider means and having another input coupled with the second output of said programmable frequency divider for developing a control signal and applying such control signal to said local oscillator for controlling the output frequency thereof;
   counter circuit means coupled with said programmable frequency divider means for initially setting said divider means to a predetermined division ratio and operating to change the programmable fraction of division thereof in accordance with changes in the count in said counter circuit means; and
   control circuit means coupled with the output of said frequency discriminator means and further coupled with said counter circuit means for causing said counter circuit means to count in a predetermined direction determind by the state of the output signal from said discriminator means in the absence of a predetermined signal output from said frequency discriminator means until a predetermined maximum count is attained, thereupon resetting said counter circuit means to a count which is a predetermined amount less than said maximum predetermined count and continuing to count in the same predetermined direction from said new count to continuously change the programmable fraction of said frequency divider in accordance with the state of operation of said counter, said control means operating in response to said predetermined signal output from the frequency discriminator means for terminating operation of said counter circuit means.

2. The combination according to claim 1 wherein said programmable frequency divider means comprises a first programmable frequency divider coupled between the output of said reference oscillator and said one input of said phase comparator means; and a second programmable frequency divider connected between the output of said local oscillator and said another input of said phase comparator means; and means coupled with said control circuit means for setting said second programmable frequency divider to a predetermined programmable division ratio uniquely identified with a selected channel to which the television receiver is to be tuned; and said counter circuit means is coupled with said first programmable frequency divider.

3. The combination according to claim 2 wherein said first programmable frequency divider initially is set to the same predetermined division ratio at the time of selection of a new channel to which the receiver is to be tuned, and said second programmable frequency divider is set to a division ratio uniquely identified with the channel selected.

4. The combination according to claim 1 wherein said counter circuit means includes a reversible digital counter coupled with said programmable frequency divider, and said control circuit means causes said counter circuit means to count in said predetermined direction when the output of said frequency discriminator is of a first state and to count in the opposite direction when the output of the frequency discriminator is of a second state.

5. The combination according to claim 4 wherein said programmable frequency divider means comprises a first programmable frequency divider coupled between the output of said reference oscillator and said one input of said phase comparator means; and a second programmable frequency divider connected between the output of said local oscillator and said another input of said phase comparator means; and means coupled with said control circuit means for setting said second programmable frequency divider to a predetermined programmable division ratio uniquely identified with a selected channel to which the television receiver is to be tuned; and said counter circuit means is coupled with said first programmable frequency divider.

6. The combination according to claim 5 wherein said first programmable frequency divider initially is set to the same predetermined division ratio at the time of selection of a new channel to which the receiver is to be tuned, and said second programmable frequency divider is set to a division ratio uniquely identified with the channel selected.

7. The combination according to claim 1 further including carrier sensing means coupled to receive at least the carrier signal components of the composite signal and providing an output voltage indicative of the tuning of said receiver to a carrier component of said composite signal; and synchronizing signal components sensing means coupled to receive at least said synchronizing signal components of the composite signal for providing a predetermined output with synchronizing signal components sensed thereby; and wherein said control circuit means is further coupled to the outputs of said carrier sensing means and said synchronizing signal components sensing means for terminating operation of said counter circuit means in response to a predetermined combination of outputs of said frequency discriminator, said carrier sensing means, and said synchronizing signal components sensing means.

8. The combination according to claim 7 wherein said programmable frequency divider means comprises a first programmable frequency divider coupled between the output of said reference oscillator and said one input of said phase comparator means; and a second programmable frequency divider connected between the output of said local oscillator and said another input of said phase comparator means; and means coupled with said control circuit means for setting said second programmable frequency divider to a predetermined programmable division ratio uniquely identified with a selected channel to which the television receiver is to be tuned; and said counter circuit means is coupled with said first programmable frequency divider.

9. The combination according to claim 8 wherein said first programmable frequency divider initially is set to the same predetermined division ratio at the time of selection of a new channel to which the receiver is to be tuned, and said second programmable frequency divider is set to a division ratio uniquely identified with the channel desired.

10. The combination according to claim 7 further including an automatic gain control amplifier means having an output coupled with said control means for preventing said control means from terminating operation of said counter means when the output of said automatic gain control means is less than a predetermined threshold voltage level.

11. The combination according to claim 1 further including means in said control circuit means for causing said counter means to count initially for a predetermined time interval irrespective of the presence or absence of said predetermined signal output from the frequency discriminator means.

12. The combination according to claim 4 further including means in said control circuit means for causing said counter means to count initially for a predetermined time interval irrespective of the presence or absence of said predetermined signal output from the frequency discriminator means.

* * * * *